(12) United States Patent
Kazarinov et al.

(10) Patent No.: US 6,580,850 B1
(45) Date of Patent: Jun. 17, 2003

(54) OPTICAL WAVEGUIDE MULTIMODE TO SINGLE MODE TRANSFORMER

(75) Inventors: Rudolf Feodor Kazarinov, Lubbock, TX (US); Nikolai Michael Stelmakh, Lubbock, TX (US); Henryk Temkin, Lubbock, TX (US)

(73) Assignee: Applied WDM, Inc., Lubbock, TX (US)

( * ) Notice: Subject to any disclaimer, the term of this patent is extended or adjusted under 35 U.S.C. 154(b) by 6 days.

(21) Appl. No.: 09/722,100

(22) Filed: Nov. 24, 2000

(51) Int. Cl.[7] .............................. G02B 6/26; G02B 6/42
(52) U.S. Cl. .............................. 385/28; 385/16; 385/89
(58) Field of Search ............................... 385/16, 28, 89

(56) References Cited

U.S. PATENT DOCUMENTS

| | | | |
|---|---|---|---|
| 4,667,331 A | | 5/1987 | Alferness et al. ............. 372/12 |
| 4,725,131 A | | 2/1988 | Goodwin et al. ............ 350/174 |
| 5,418,868 A | * | 5/1995 | Cohen et al. ................. 359/109 |
| 5,574,808 A | * | 11/1996 | van der Tol .................... 385/16 |
| 6,188,818 B1 | * | 2/2001 | Han et al. ...................... 385/131 |
| 6,229,947 B1 | * | 5/2001 | Vawter et al. ................. 385/28 |
| 6,310,995 B1 | * | 10/2001 | Saini et al. ............... 359/341.1 |
| 6,324,326 B1 | * | 11/2001 | Dejneka et al. ............. 359/152 |
| 6,334,716 B1 | * | 1/2002 | Ojima et al. ................. 359/152 |

FOREIGN PATENT DOCUMENTS

| | | |
|---|---|---|
| EP | 0 251 427 | 1/1988 |
| WO | WO-96 25779 | 8/1996 |
| WO | WO-98 35250 | 8/1998 |
| WO | WO-98 48495 | 10/1998 |

OTHER PUBLICATIONS

"Efficient Coupling of a Semiconductor Laser to an Optical Fiber by Means of a Tapered Waveguide on Silicon," Y. Shani, C. H. Henry, R. C. Kistler, K. J. Orlowsky, and A. Ackerman, Appl. Phys. Lett., vol. 55, pp. 2389–2391.

"Integrated Optic Adiabatic Devices on Silicon," Y. Shani, C. H. Henry, R. C. Kistler, R. F. Kazarinov, and K. J. Orlowsky, IEEE Journal of Quantum Electronics, vol. 27, No. 3, pp. 556–566, Mar. 1991.

"Integrated Four–Channel Mach–Zehnder Multi–Demultiplexer Fabricated with Phosphorous Doped SiO2 Waveguides on Si," B. H. Verbeek, C.H. Henry, N.A. Olsson, K. J. Orlowsky, R. F. Kazarinov, B. H. Johnson, Journal of Lightwave Technology, vol. 6, No. 6, pp. 1011–1015, Jun. 1988.

Schanen Duport, I et al, "New Integrated–Optics interferometer in planar technology", Applied Optics, vol. 33, No. 25, pp. 59545958.

Alphonse, G.A., "High–Power Superluminescent Diodes", IEEE Journal of Quantum Electronics, vol. 24, No. 12, Dec. 1998, pp. 2452–2457.

Ching–Fuh, L., "High–Power Superluminescent Diodes", IEEE Photonics Technology Letters, vol. 8, No. 2, Feb. 1996.

* cited by examiner

*Primary Examiner*—Robert H. Kim
*Assistant Examiner*—Richard Kim

(57) ABSTRACT

An optical waveguide mode transformer has a substrate supporting a high refractive index core layer surrounded by lower refractive index cladding. The core layer includes a wide input waveguide section to accept a multimode, including a fundamental mode, light input. The input waveguide section is coupled to a narrow output waveguide section by a tapered region having a taper length enabling adiabatic transfer of the fundamental mode of the multimode light from the wide input waveguide section to the output waveguide section while suppressing(stripping) other modes of the multimode light input. The narrow output waveguide section supports a single mode light output comprising said fundamental mode. The core layer is contoured to include a localized upstanding ridge intermediate opposite lateral sides of the core layer. The output waveguide section includes a portion having a real index step between the core layer and cladding layers, and advantageously is functional to output a light beam having similar vertical and horizontal divergences.

19 Claims, 6 Drawing Sheets

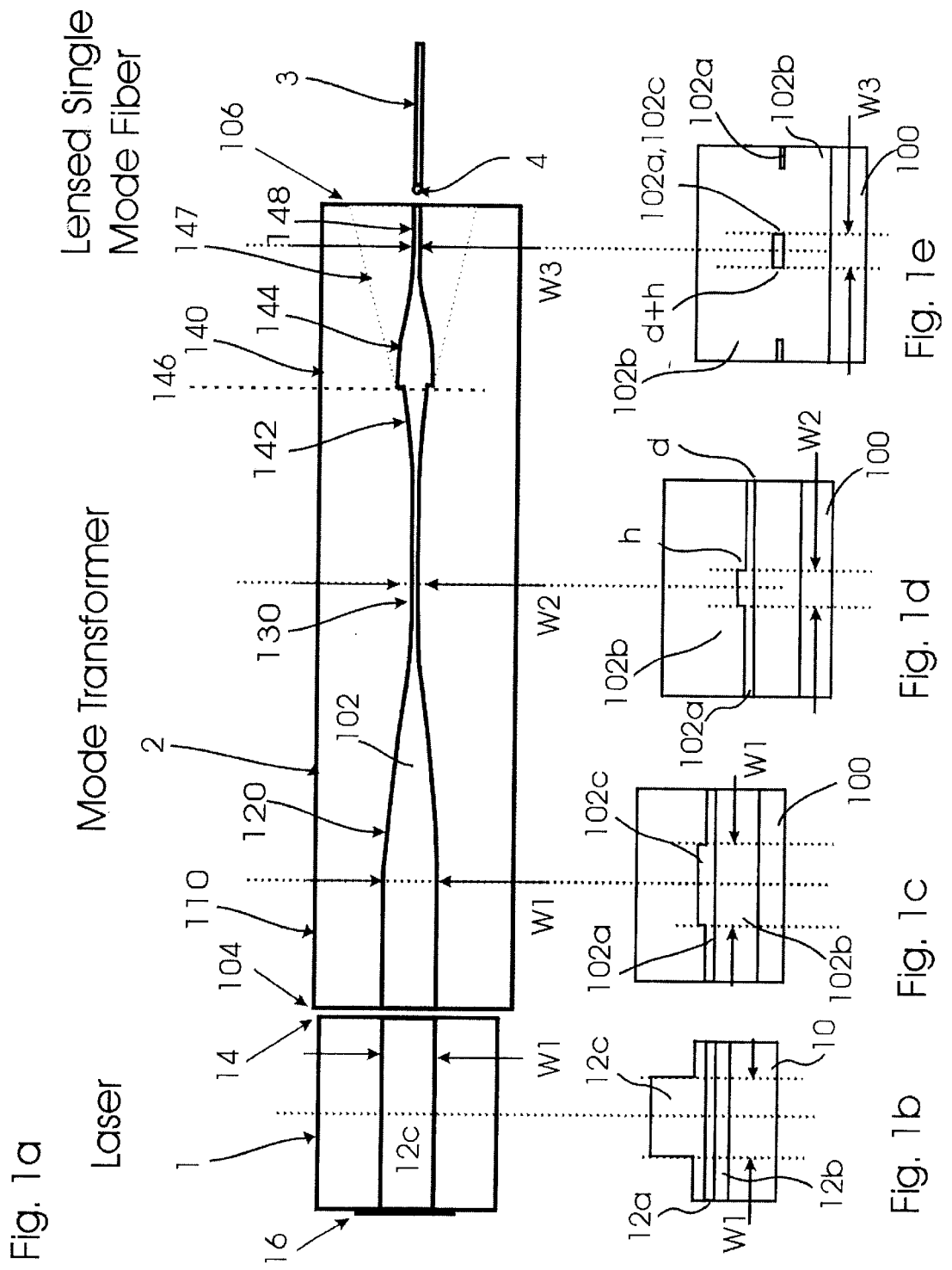

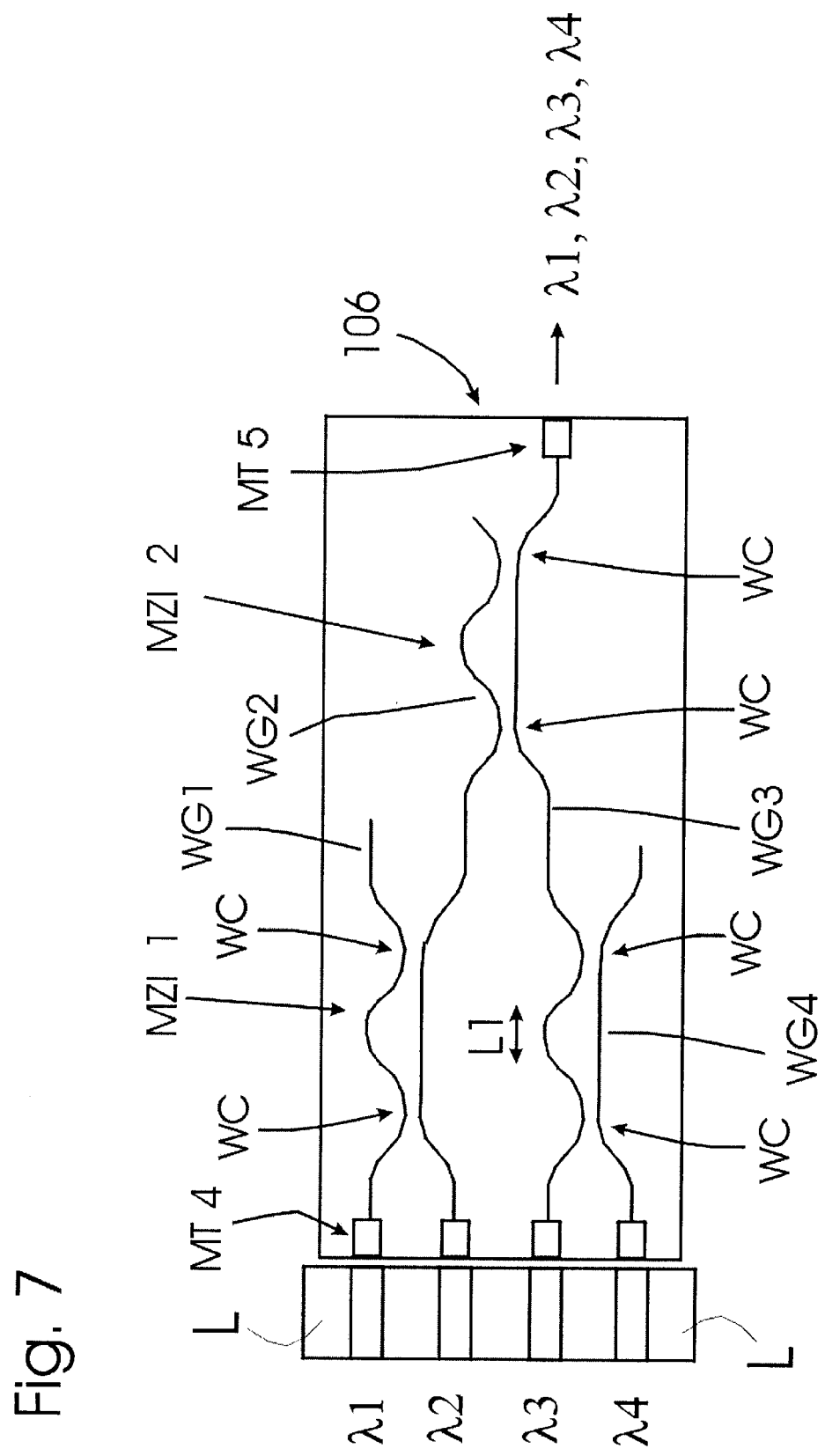

OPTICAL WAVEGUIDE MULTIMODE TO SINGLE MODE TRANSFORMER

FIELD OF THE INVENTION

This invention relates to optical waveguide multimode to single mode transformers and to applications of such transformers in transferring optical signals from a laser to an optical fiber.

BACKGROUND OF INVENTION

Advances in optical amplifiers based on either erbium doped fiber or Raman amplification require increased power launched into a single mode optical fiber. Single mode lasers used as pumps for optical amplifiers can provide launched powers of approximately 200 mW at a wavelength of 980 nm. The requirement of single mode operation limits the width of the laser active layer to 3–4 microns. This results in high optical power density at the mirror of the laser and consequently mirror damage. Higher powers are provided by arrays of single mode pump lasers, with each laser operating at a slightly different wavelength. The different wavelengths can be combined into a single mode fiber using wavelength division multiplexing techniques. This approach is limited in the number of lasers that can be practically operated at the same time, as well as by the finite spectral width of the pumping band of optical amplifiers.

Significantly larger output powers can be obtained from broad area lasers, which typically have transverse dimensions of 10 to 100 microns, and without any structures that might stabilize the mode. It thus cannot operate in the lowest transverse mode. The output is divergent, 30–40 degrees in the vertical direction, because the mode in the laser is confined to a very thin active region and it is diffracted at the laser facet. Devices with an active region width of 100 microns typically can provide power output of up to two watts. However, a limitation of a broad area laser is the filamentary nature of the laser field, which in the absence of any mode stabilizing structure breaks up into filaments resulting in non-uniform optical power density across the mirror. This type of laser may be used as a pump in amplifiers or lasers that do not require coupling to single mode fibers. In fact coupling to a single mode fiber is not possible because of the multimode nature of broad area lasers.

Use of a pointed tapered waveguide for coupling a laser to an optical fiber has been proposed in "Efficient coupling of a semiconductor laser to an optical fiber by means of a tapered waveguide on silicon," Y. Shani, C. H. Henry, R. C. Kistler, K. J. Orlowsky, and A. Ackerman, Appl. Phys. Lett., vol. 55, pp. 2389–2391. "Integrated Optic Adiabatic Devices on Silicon," Y. Shani, C. H. Henry, R. C. Kistler, R. F. Kazarinov, and K. J. Orlowsky, IEEE Journal of Quantum Electronics, vol. 27, No. 3, pp. 556–566, March 1991, discloses a waveguide, which may support a few modes and is adiabatically narrowed to a single-mode waveguide and then widened again, adiabatically, to its former size. It is stated that the possible higher order states are stripped off in the narrow waveguide region so that only the fundamental mode remains.

It is known that suppression of filamentary operation results in significantly higher power output but mismatch between the mode of the laser and that of the optical fiber remains. Aspects of the present invention address two problems, stabilization of a broad area laser output to provide a single mode optical signal and efficient coupling of single mode optical signals to a single mode optical fiber.

SUMMARY OF THE INVENTION

According to the invention, a method of optical radiation mode transformation comprises introducing multimode optical radiation into a waveguide structure providing adiabatic transformation of a fundamental mode of said multimode optical radiation to single, fundamental mode optical radiation. Preferably, multimode optical signals are output from a laser into a waveguide structure having a lateral waveguiding dimension that varies along the length of the waveguide structure in a manner effecting transformation of a fundamental mode of said multimode optical signals to a single, fundamental mode, and outputting said single, fundamental mode optical signals to an optical fiber supporting transmission of said single, fundamental mode signal.

An optical waveguide mode transformer embodying the invention comprises an optical waveguide structure including a high refractive index core layer between lower refractive index cladding layers, said core layer including a wide input waveguide section coupled by an intermediate waveguide section to an output waveguide section, said intermediate waveguide section including a tapered region; said wide input waveguide section having a width to accept a multimode, including a fundamental mode, light input, said output waveguide section having a width to support a single mode light output comprising said fundamental mode, and said tapered region having a taper length enabling adiabatic transfer of said fundamental mode of said multimode light from said wide input waveguide section to said output waveguide section. Advantageously in the input and intermediate waveguide sections, the core layer is contoured to provide an effective index step portion to control lateral waveguiding of light propagated along the waveguide structure, and the output waveguide section includes an output waveguide portion having a real index step between the core layer and the cladding layers, and is functional to output a light beam having similar vertical and horizontal divergences. This enhances coupling of the light beam to a single mode optical fiber.

A preferred embodiment of the invention employs two types of solid state optical waveguide, to provide, on the one hand, efficient coupling to the laser by using a ridge waveguide to implement an effective index step structure, and on the other hand, to provide efficient coupling to a single mode optical fiber by using a waveguide with a real index step. A real index step may be obtained by using as the core of the waveguide, a material having an index of refraction that is larger than the index of refraction of the cladding layer. This can be done by surrounding the material of the core layer with a material having a lower index of refraction. This is in contrast to structures in which the effective index of refraction is increased, in the lateral direction, by a confinement structure fabricated in or on the cladding layer. Such a waveguide can be formed by etching the core layer to define an upstanding rib along the length of the core, without introducing any differences in the materials of the core layer of the waveguide. The transition of the fundamental mode of the optical beam from one type of waveguide to the other is accomplished adiabatically in order to minimize optical losses. In addition, a cross-sectional plane is defined at which the modes of the two types of waveguide are closely matched. Such a circuit is referred to as a mode transformer, which functions to transform a multimode optical signal to a single (fundamental) mode optical signal. Advantageously, the real index waveguide section can be structured to output a light beam having similar vertical and horizontal divergences, enhancing coupling of the light beam to a single mode optical fiber. In an alternative implementation, the mode transformer utilizes a solid state waveguide, which has a tapered P-doped silicon dioxide core on a silicon nitride layer to obtain an effective increase in the index of refraction.

A mode transformer embodying the invention may be employed in conjunction with a solid state laser to implement an external cavity solid state laser. A solid state laser is coupled to output a divergent beam, multimode optical signal, including a fundamental mode, to an optical waveguide mode transformer. The solid state laser and the optical waveguide mode transformer have anti-reflective coated neighboring end surfaces; the laser has a high reflectivity coated opposite surface and the mode transformer has a low-reflectivity coated opposite end surface. The optical waveguide mode transformer comprises low refractive index cladding material on either side of a high refractive index core layer and the core layer may include a lengthwise extending ridge having a width that functionally changes along its length to accept the multimode optical signal output from the solid state laser to transform the fundamental mode of the multimode optical signal to a single fundamental mode optical signal, without significant loss of intensity of the fundamental mode signal. This fundamental mode signal is propagated to an output section of said optical waveguide mode transformer, terminating at the low reflectivity coated end of the mode transformer, which supports single mode propagation of said fundamental mode optical signal.

It should be emphasized that a mode transformer embodying the invention does not function to convert the order of the transverse mode of optical radiation; specifically, it does not convert higher order modes to the fundamental mode. The mode transformer functions, in one direction of propagation, to change the field distribution of the fundamental mode of a multimode input signal from a large spatial extent to a small one, and vice versa in the opposite direction of propagation, with minimal loss of fundamental mode beam intensity, i.e. adiabatically. As the dimension of the transverse mode is reduced by reducing the width of the taper section of the solid state waveguide, higher order modes cannot be supported any more and are radiated out (stripped) from the sides of the waveguide core.

In application to amplifiers pumping single mode fibers, a lens formed at the input end of the fiber results in higher launched power. In other applications, where high power launched into solid state waveguide is of interest, a cylindrical lens (e.g. a piece of optical fiber) is placed between the laser and the cleaved input face of the waveguide of the mode transformer. The latter application relies on broad area lasers. The effect of the lens is to collimate laser output in a vertical direction. A mode transformer embodying the invention can be used, in combination with the laser and a cylindrical lens, to stabilize the laser output in the fundamental mode and to couple it efficiently into a single mode fiber.

BRIEF DESCRIPTION OF THE DRAWINGS

FIG. 1a is a top plan representation of a system including an optical waveguide mode transformer embodying the invention to provide coupling between a broad area solid state laser and a single mode optical fiber;

FIG. 1b is a cross section of the broad area laser depicted in FIG. 1a;

FIGS. 1c, 1d and 1e are cross-sections at locations along the length of the mode transformer depicted in FIG. 1a;

FIG. 7 depicts another system embodying the invention employing a Mach-Zehnder Interferometer (MZI) multiplexer.

DESCRIPTION OF EMBODIMENTS OF THE INVENTION

Figure 2A:
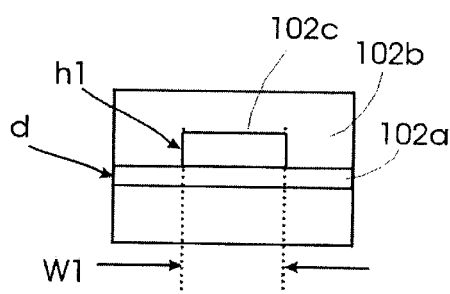
FIGS. 2a, 2b and 2c are cross sections of an alternative construction of the mode transformer depicted in FIG. 1a, at locations corresponding to FIGS. 1b, 1c and 1d, respectively.

Throughout the specification and claims, references to "multimode" and "single mode" apply to the transverse (horizontal) dimension of the waveguide (unless otherwise stated); in a vertical dimension, it is assumed only a single (fundamental) mode is supported. In the vertical direction the peak power is always at the center of the waveguide. The output can be described as having a single lobe in the vertical direction, centered at the active region of the waveguide. In a single mode waveguide this will also be true in the horizontal direction. However, if the waveguide becomes wider, in the horizontal direction, other modes become possible. These may have, for instance, a minimum at the center of the waveguide between two symmetric maxima. There are small differences in wavelength between these two types of modes but the present invention is primarily concerned with spatial distributions of intensity.

FIG. 1a shows a top view of an optical waveguide mode transformer 2 designed to provide transformation of a multimode optical signal output from a broad area laser 1 to a single (fundamental) mode and an efficient coupling of that single mode optical signal as an input to an optical fiber 3 supporting single mode transmission. The broad area laser 1 has a semiconductor substrate 10 on the top surface of which is formed an optical waveguide strip 12 which extends between opposite front and back end surfaces (or facets) of the substrate 10. The waveguide strip 12 comprises a high refractive index core layer 12a, suitably a narrower bandgap semiconductor, sandwiched between cladding layers 12b (not shown in FIG. 1a), suitably a wider bandgap semiconductor, such that there is a refractive index difference between the core layer 12a and the cladding layers 12b. The front end surface of the substrate 10 has an anti-reflective coating 14 and the back end surface has a high reflectivity mirror coating 16.

Intermediate the lateral edges of the waveguide strip 12, the upper cladding layer 12b defines an upstanding ridge 12c extending along the length of the core layer, preferably equidistant from both lateral edges of the core layer 12. The core layer 12a supports vertical single mode waveguide operation and the width of the ridge 12c provides lateral waveguiding, confining optical transmission to the width of the ridge portion.

The optical fiber 3 has a "gathering" lens 4 at its front end, suitably formed by either etching or machining or heat-treating the end of the fiber until a suitable convex surface is formed. The laser 1, mode transformer 2 and optical fiber 3 are mounted in physical proximity to each other, typically the laser 1 and the optical fiber 3 each being separated from the mode transformer 2 by several microns.

The mode transformer 2 is designed to couple a highly divergent (primarily in a vertical plane) multimode light output from the laser 1 to the single mode lensed fiber 3. Cross sectional views of the mode transformer 2 are depicted in FIGS. 1c, 1d, and 1e. The mode transformer 2 has a semiconductor (e.g. silicon) substrate 100 on the top surface of which is formed an optical waveguide strip 102 which extends between opposite front and back end surfaces (or facets) of the substrate 100. The waveguide strip 102 comprises a high refractive index core layer 102a, suitably silicon nitride, located between cladding layers 102b, suitably silicon dioxide, which has a lower refractive index than silicon nitride, such.that there is a high refractive index difference between the core layer 102a and the cladding layers 102b.

Intermediate the lateral edges of the waveguide strip 102, the core layer has a low, upstanding ridge or stepped portion 102c extending along its length, preferably equidistant from both lateral edges of the core layer 102. The core layer 102 has a height d over its lateral edge margins which increases by an amount h (to d+h) over the central stepped region 102c. The end surfaces of the semiconductor substrate 100 at the input and output ends of the mode transformer 2, have coatings 104 and 106, respectively. The coating 104 is an anti-reflection coating and the coating 106 has controlled reflectivity of about ten percent (10%). The combination of materials used for the core layer and the cladding layer provides high index difference between the core and cladding layers, to assure large acceptance angle at the input section 110 of the mode transformer 2 to enhance the amount of optical radiation transferred from the laser 1 to the mode transformer input section 110. The lateral waveguiding is obtained by forming a ridge in the core layer, as shown in cross-section in FIGS. 1b, 1c, and 1d, which increases the effective index of refraction. The width of the ridge, in relation to its height, is selected in known manner to ensure lateral confinement of the propagated optical radiation essentially in the region at the transition between the ridge and the underlying core material.

The waveguide mode transformer includes four sections indicated in FIG. 1a. At the input section 110 the ridge 102c has a width W1, matching that of the ridge 12c of the laser 1, permitting acceptance of multimode optical signals from the broad area laser 1. In a multimode to fundamental mode transformer section 120 the ridge 102c is gradually tapered in width from W1 down to W2. The height of the ridge remains constant. The tapered section 120 functions to radiate out from its sides (i.e. to strip) higher order modes of the multimode optical signal accepted into the waveguide input section from the laser 1, where the waveguide width is W1. In the tapered section 120, the waveguide ridge 102c is tapered, narrowing in width gradually from W1 to W2, and transitions to section 130 which has a ridge 102c of constant width W2. At the narrower waveguide section 130, where the width is W2, only the fundamental mode of the multimode optical signal received from the laser 1 remains. The rate of taper of the ridge along section 120 is selected to assure adiabatic change in the width of the fundamental mode of the optical signal during propagation along the tapered section from the waveguide input section 110 (width W1) to the section 130 (width W2), i.e. essentially without loss in intensity of the fundamental mode of the optical signal. In section 130 only the fundamental mode of the optical signal remains.

The waveguide section 130 transitions into an output section 140 the function of which is to shape the divergence of the optical signal beam output from the mode transformer 2, to make the beam divergence nearly equal in the horizontal and vertical directions. In the waveguide section 140, from the beginning of taper 144 to the end facet 106, the lateral margins of the silicon nitride core 102 are etched through to form a real index guided structure, as shown in FIG. 1d. The transition between sections 130 and 140 is provided by two tapered regions 142 and 144 of the core layer ridge 102c; the tapered region 142 increases in width from W2 while the tapered region 144 decreases in width to W3.

The overall length of the tapered regions 142, 144 is, in practice, a trade off between lowering signal loss in the section 140 and practical preference for a short section 140. The first tapered region 142 has an increasing width taper which functions to expands the fundamental mode of the optical signal received from the narrow ridge waveguide section 130 in the transverse, horizontal direction. In this tapered region 142, the height of the ridge 102c is constant. At the transition 146 between the tapered regions 142 and 144, the wide end of the tapered region 144 is wider than that of the tapered region 142 to accommodate the expanded fundamental mode optical signal exiting the tapered region 142. For the particular embodiment being described, at the transition 146 between two tapers of section 13, the effective width of the single mode is 1 micron wider than that of the ridge; the width is determined by the selection of materials of the waveguides and the height and width of the ridge. Along the output region 148 of the section 140, the waveguide core layer ridge 102c has a constant width, terminating at the front end surface of the substrate 100 for outputting to the single mode optical fiber 3, a single mode optical beam having similar vertical and horizontal divergences. In this output region 148, only the outer, edge regions of the lateral margins of the core layer 102 remain, the intervening portions having been etched through to produce an increasing width taper portion 147, having a contour indicated by broken lines in FIG. 1a, in which the core layer is not present. In the tapered regions 142, 144, the single mode optical beam is first expanded and then tapered down in order to improve lithographic tolerance required to form the waveguide. This does not produce any appreciable additional loss. The wedge shaped etched region 147 is designed to produce total internal reflection, at the silicon dioxide (102b)—silicon nitride core (102a) interface, of radiation stripped from the tapered waveguide in section 120 and propagating back towards the back interface 106 after reflection from front end surface 104 of the waveguide 102.

In a particular design embodiment, a waveguide including a core layer of silicon nitride having a thickness d=0.15–0.18 micron would provide an acceptance angle of 35–40 degrees at the input section 110 of the mode transformer 2. The desired lateral waveguiding is obtained by forming the low core layer ridge as shown in cross-section FIGS. 1b, 1c, and 1d, with a step of h=10 nm which is sufficient to assure single mode operation with a ridge width up to about 4 microns. In the multimode to fundamental mode transformer section 120 the ridge 102c would be gradually tapered in width from W=10–50 microns down to W2=4 microns. The height of the ridge remains constant. The taper region in the section 120 extends over a distance of 1–2 mm, to permit an adiabatic change (in terms of optical signal fundamental mode intensity) from multimode to fundamental mode optical signal. In the section 130, the ridge width remains constant at W2. In the output section 140, the first tapered region 142 has an increasing width taper from 4 to 6 microns. The taper of the region 144 commences with a width of about 7 microns at the transition 146 and tapers down to W3=1 micron, appropriate for the real index waveguide structure. At the transition from the tapered region 142 to the tapered region 144, the effective width of transverse fundamental mode of the optical signal is about 1 micron wider than the width of the ridge 120c. The overall length of the tapered regions 142, 144 is about 1 mm. At the output region 148, the silicon nitride core width has reduced to about 1 micron. Its thickness d+h is the same as that of the silicon nitride layer of sections 110, 120 and 130. For this geometry (d=0.15 micron) an output optical beam divergence of 20 (horizontal)×24 (vertical) degrees may be obtained.

Figure 2B:
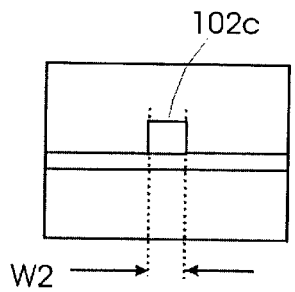
Figure 2C:
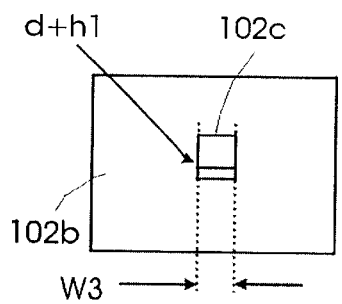

Another way of obtaining controllable lateral confinement is to form a waveguide structure, in which the vertical confinement is provided by a uniform width silicon nitride core layer 102a with a thickness d=0.15 micron, and an overlying layer of lower refractive index, doped silicon dioxide to form the ridge 102c, instead of the silicon nitride ridge described with reference to FIGS. 1a–1d. The silicon dioxide ridge, with a thickness h1=0.5–1.0 micron, may be doped with about 7% of phosphorus to assure a sufficiently high index of refraction. The structural layout of the mode transformer 2 is the same as that shown in FIG. 1a. Cross sections of the thus modified mode transformer are shown in FIGS. 2a, 2b, and 2c which correspond to the same locations of the cross-sections as those of FIGS. 1c, 1d, and 1e.

Simulated performance of such a chip structure is similar to that of the mode transformer 2 shown in FIG. 1. The widths of the SiO2 regions W1, W2, and W3 are also similar as in the embodiment described with reference to FIG. 1.

Figure 3:
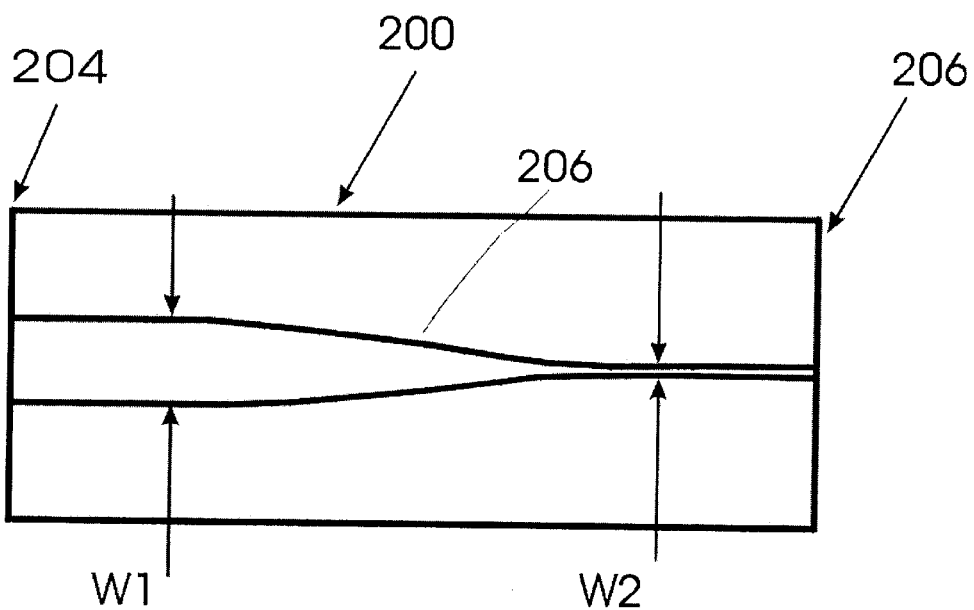
FIG. 3 is a top plan view depiction of another embodiment of the present invention.

A simplified version of a mode transformer 200 embodying the invention may be provided by a waveguide with a lateral taper as depicted in FIG. 3. The waveguide could employ a silicon dioxide clad high refractive index, e.g. silicon nitride, core as described with reference to FIG. 1, except that the ridge 102c would be omitted, so that the core would have a uniform thickness across its width. This is a real index step structure. In this mode transformer 200, illustrated in FIG. 3, the waveguide core layer is wide (width W1) at its input end region 204, to receive optical output from a broad area laser such as the laser 1 shown in FIG. 1, and a narrow core layer at its output end 206 to couple a fundamental mode optical output to a single mode optical fiber 3, such as optical fiber 3 shown in FIG. 1. The tapered section 208 of the waveguide core adiabatically transforms a multimode signal received from a broad area laser (e.g. a laser 1 as shown in FIG. 1a) to a single, fundamental mode optical signal for output to a single mode optical fiber, such as the optical fiber 3,4 shown in FIG. 1a. This embodiment of a mode transformer would change the vertical divergence of the optical beam received from a laser only slightly. The width of the laser beam would change from W1~10–30 microns to W2~6 microns. The taper length would be about 1 mm, a length selected to minimize losses.

The output power of a laser can be increased by increasing the width W1 of the active region. This results in multi-transverse mode operation and such a laser cannot be used to provide an optical input to a single mode optical fiber. The mode transformer devices described with reference to FIGS. 1 to 3 can be used to assure single transverse mode operation of a high power laser with a wide active region, provided the mode transformer device is effectively part of the laser cavity. The laser 1 and mode transformer described with reference to FIG. 1 together form such an external cavity laser. The light output from laser 1 is coupled to the waveguide of the mode transformer device 2. In a typical embodiment the laser has an active core ridge layer 12c width W1 greater than 10 microns, matched to the width W1 in the input section 110 of the mode transformer 2. The light guiding structure of the laser (ridge 12c) is about 1.0 micron thick. In order to form the overall laser cavity, the back facet 16 of the laser 1 is high-reflection coated while the front facet 14 is anti-reflection coated. This suppresses laser operation within the internal cavity of the laser 1. The back facet 106 of the mode transformer 2 is also anti-reflection coated, thus preventing feedback to the laser 1. The front facet 104 of the mode transformer 2 has controlled reflectivity of about 10%. This configuration results in lasing in the external cavity defined by the coated surfaces 16 and 104. The light output from the front surface 104 is well matched to the single mode optical fiber 3, terminated with a lens 4. Since the single mode waveguide section 130 of the mode transformer 2 transmits only the fundamental mode, vertical and lateral, of the optical signal, the optical feedback from surface 104 supports only the fundamental mode. This stabilizes the laser operation in a fundamental lateral mode. Another possibility of providing single mode feedback is to place a reflective grating in the fiber itself. In this case the surface 104 is made to minimize reflections. By placing a narrow width reflection grating, such as a conventional fiber Bragg reflector, in the single mode optical fiber 3, the range of emission wavelength of the overall system (i.e. laser, mode transformer and optical fiber) may be selected.

It should be emphasized that reflections from the end facets of the mode transformer 2 are detrimental to the operation of the laser in the fundamental mode. The presence of feedback would introduce a cavity between facets at which the reflection originates and the back facet of the pump laser 1. Such cavities destroy fundamental mode selection. It is thus important to minimize reflections. This can be done by providing anti-reflection coating of the facets, as described above. (In context, 10% reflectivity used on a facet that forms a part of the external cavity laser, is a significant reflectivity; to prevent reflections, reflectivities of less than 0.1% are desirable.)

Figure 4:
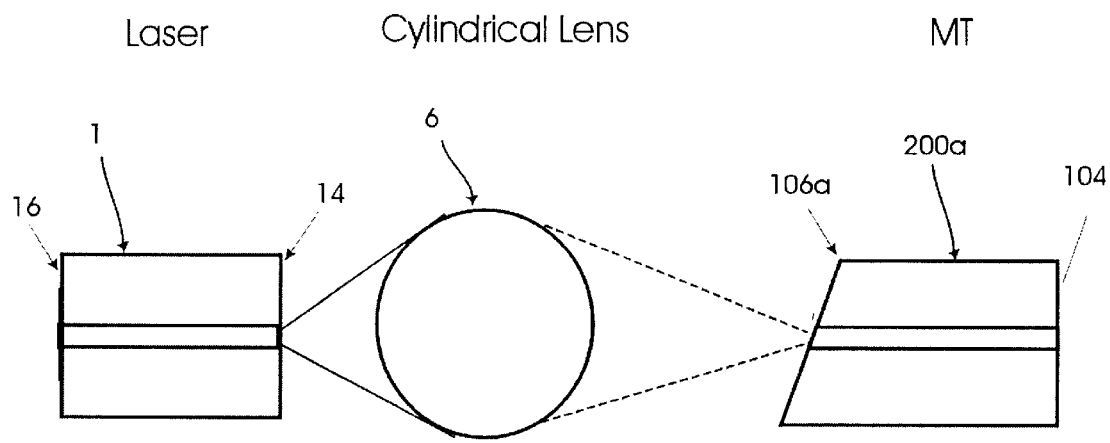
FIG. 4 is a side view depicting another system embodiment of the invention.

Another way of alleviating internal reflections is shown in FIG. 4. The figure shows a side view of the pump laser 1 coupled to a mode transformer 200 embodying the invention, through a collimating cylindrical lens 6 (conveniently, a short length of optical fibre). The mode transformer 200a outputs a single, fundamental mode optical signal to a single mode optical fiber (not shown in FIG. 4) in the manner indicated in FIG. 1. The use of a cylindrical lens 6, spaced from the laser facet 14 to match the optical signal output from the laser 1 to the input section of the waveguide core layer of the mode transformer 200a relaxes the requirement for mode matching between the laser 1 and the mode transformer 200a because the lens 6 reduces the effective divergence of the light beam input to the mode transformer 200a In this configuration, because there is no need to accept a widely divergent input beam, a mode transformer of the type illustrated in FIG. 3 can be used, modified to have an oblique facet 106a. The tilt in the facet of the mode transformer 200a, typically 5 to 10 degrees, is an important aspect of this arrangement. The tilted facet 106a is important in achieving elimination of optical feedback to the laser 1, relaxing the requirement on the anti-reflection coating of the front facet 106a of the mode transformer 200a. The anti-reflection coating on the front facet 14 and high reflection coating of the back facet 16 of the laser 1 are still required. This implementation of an external cavity laser still provides fundamental mode stabilization of the pump laser 1, as well as efficient coupling to a single mode optical fiber 3, such as the optical fiber 3 shown in FIG. 1a.

Figure 5:
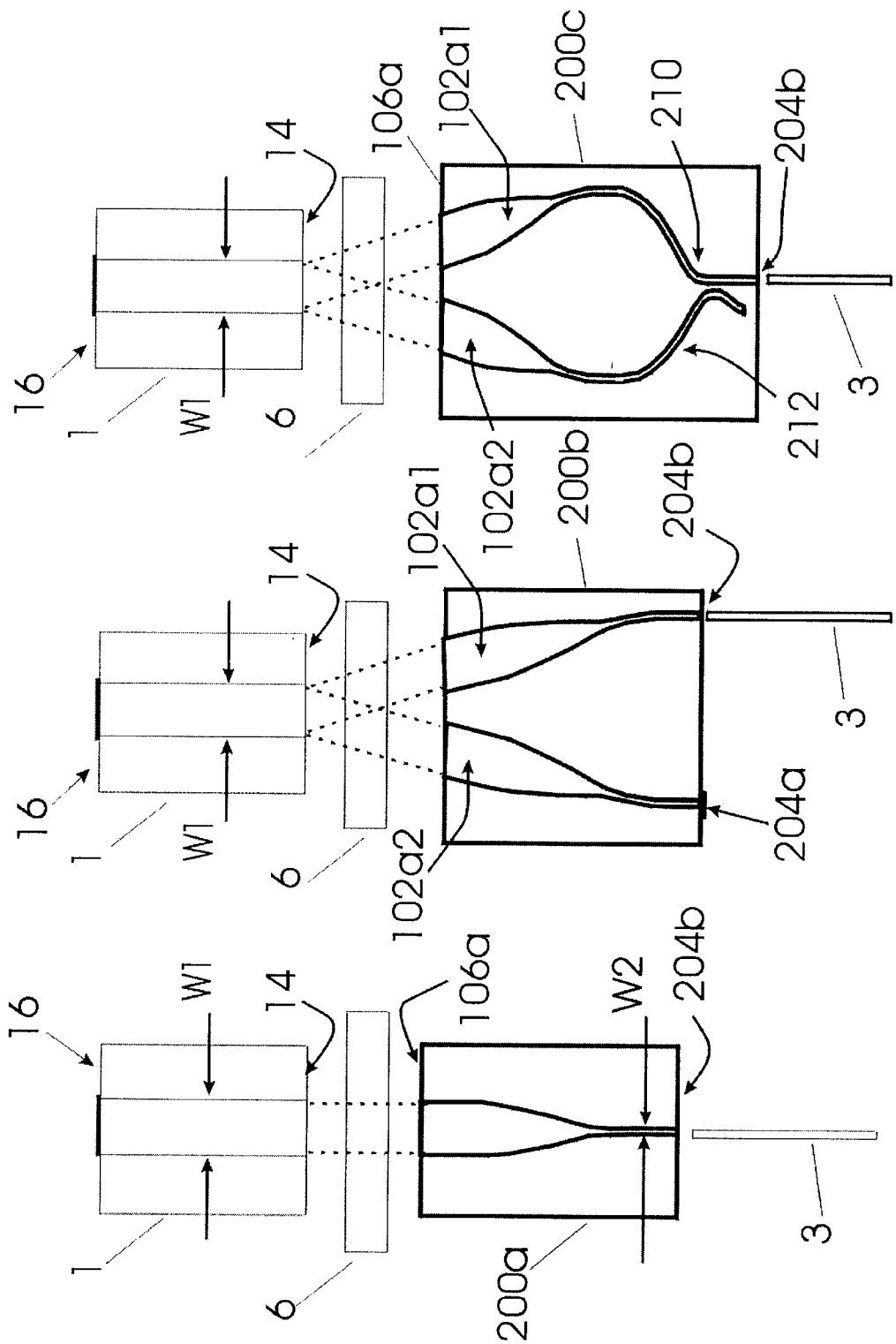
FIGS. 5a, 5b and 5c are top plan views of three alternative implementations of the arrangement depicted in FIG. 4.

FIG. 5a shows a top view of the arrangement illustrated in FIG. 4. The laser 1 produces a multimode output. The external cavity laser is formed in the manner describe above with reference to FIG. 4. Feedback to the fundamental mode is provided from surface 204b and this stabilizes the laser. FIG. 5b also shows the top view of a pump laser 1 coupled to a mode transformer 200b through the cylindrical lens 6. However, in this case, the laser 1 is modified (by increasing the width W1 of its active layer) to operate in a selected higher order mode. The light output of this laser has two lobes, emitted at approximately 10 degrees between the beams. The back facet 16 of the laser is high-reflection coated. The mode transformer 200b includes two laterally spaced apart mirror-image waveguide structures 102a1, 102a2, each similar to that employed in the mode transformer described with reference to FIG. 3, but each positioned so that the wide input end is angled with respect to the facet 106a (to align with the respective laser lobes) and extends over a slightly curved path so that the narrow output sections are more widely spaced apart at the front end surface of the mode transformer 200b. Each waveguide structure intercepts a single lobe of the optical output from the laser 1. The angle of interception is designed to account for the effective index of the mode and to couple each lobe to a fundamental mode of the mode transformer 200b. This laser can be stabilized using two reflectors, each of which is similar to that of FIG. 5a. One of the reflectors 204a, placed at the left side (as seen in FIG. 5b) of the front end surface of the mode transformer 200b, forms one end of the external laser cavity. Its reflectivity should be as high as practical. The other reflector 204b, placed at the right hand side (as seen in FIG. 5b) of the front surface (or output surface) of the mode transformer 200b, should have controlled reflectivity, similar to surface coating 106 of FIG. 1. This reflector forms the second mirror of the thus formed external cavity laser. The optical output of the external cavity laser is butt coupled (i.e. no lens 4 is used) to a single mode optical fiber.

FIG. 5c depicts a modification of the embodiment shown in FIG. 5b. The laser described in FIG. 5b is stabilized with a more sophisticated optical circuit. The structure depicted in FIG. 5c provides of stabilization of the semiconductor laser with less sensitivity to angular misalignment between the laser and the optical circuit. The semiconductor laser 1 and the collimating lens 6 remain unchanged. The output of the laser thus again has of two lobes angled by about 10° from each other and the input facet 106a is anti-reflection coated. The modified mode transformer 200c includes two waveguide structures 102a1, 102a2, similar to that employed in the mode transformer described with reference to FIG. 5b. However, instead of terminating one of the waveguide structures with a reflecting surface, the modified structure couples the two single mode waveguide sections together through a 3 dB coupler 210. The interferometric mode transformer 200c is terminated with a single reflecting surface 204b. Its reflectivity is controlled to provide the desired output. In this configuration the external cavity laser is formed between surfaces 16 of laser 1 and 204b of the mode transformer 200c. The external cavity has two parallel branches joined at the mirror 16 and the 3 dB coupler. Since the two lobes of the transverse mode of the semiconductor lasers differ in their electric field by $\pi$, a section 212 of single mode waveguide increases the length of one of the arms. This section 212 introduces an optical path length equal to $8\theta/4$, the purpose of which is to add a phase factor equal to $\pi$ to this branch of the laser cavity and thus correct for the phase difference between the two lobes.

Figure 6:
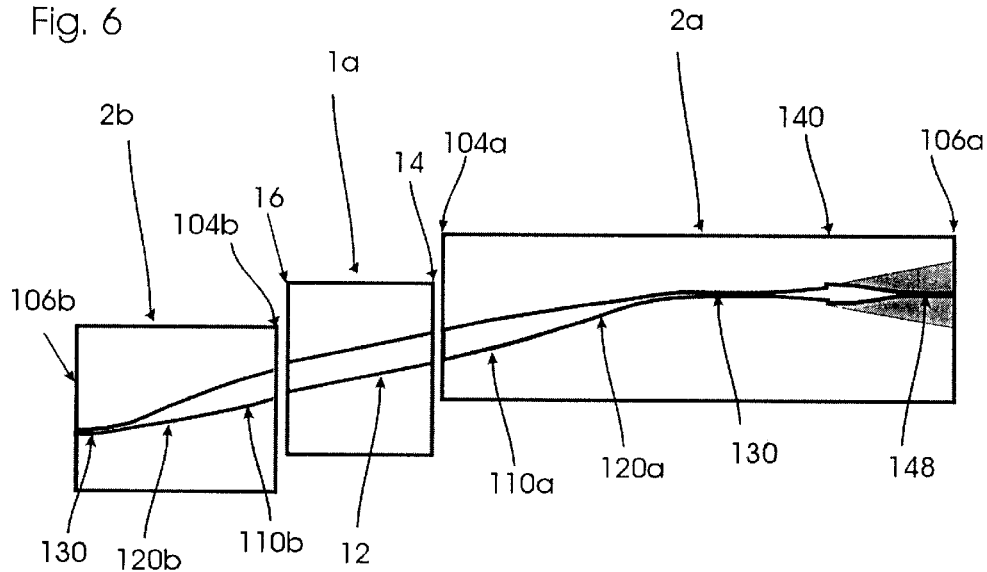
FIG. 6 is a top plan view depicting a further system embodiment of the invention.

Another way of avoiding unwanted cavities is shown in FIG. 6 which is a top view of the illustrated structure. In this configuration the active region (core layer 12a and ridge 12b) of the laser 1a is tilted, laterally, suitably at an angle of 5 to 10 degrees, with respect to cleaved facets 16, 14 of the laser 1a as shown in FIG. 6. The tilt is selected to substantially reduce, and ideally to eliminate feedback from facets 16 and 14 to the laser cavity. The mode transformer chip 2a, a modification of the type illustrated in FIG. 1, is coupled to the front facet 14 of the laser 1a. The mode transformer 2a is modified by introducing a bend in the single mode waveguide of section 130, to allow for a perpendicular interface between the waveguide section 140 and the output facet 106a. The input section 110a and the taper section 120a of the waveguide of the mode transformer 2a are also tilted with respect to the facet 104a, to allow for close coupling to the laser 1a. The respective input and output surfaces 104a, 106a of this mode transformer, correspond with those of FIG. 1. Since the effective refractive indices of the waveguides of the laser 1a and the mode transformer 2a are different, their respective tilts have to be adjusted by a few degrees to provide efficient coupling. A modified mode transformer 2b provides feedback to the back facet 16 of the laser 1a. This modification of the mode transformer chip 2a includes only sections 110b and 120b (corresponding to sections 110 and 120 of the of the mode transformer chip shown in FIG. 1), with an appropriate bend to match to the active region of the laser 1a. The back end surface 106b of the modified mode transformer chip 2b, which is perpendicular to the waveguide core, is high-reflection coated. The laser cavity is then formed between the coated back end surface 106b of the mode transformer 2b and the coated front end surface 106 of the mode transformer 2a. This configuration eliminates unwanted reflection feedback from the front end surface 104b of the mode transformer 2b and the back end coated surface 104a of the mode transformer 2a.

There is a spectral range over which a semiconductor laser can be made to lase, i.e. the laser exhibits gain for a range of wavelengths. In a normal, cleaved, cavity the laser emits at a wavelength which coincides with the peak of this gain curve. An external cavity laser can be made to lase at different wavelengths, as long as these wavelengths are within the gain curve. It is possible to form an array of external cavity lasers each having a different wavelength of operation and each outputting to an individual optical fiber. This can be done in a number of ways. The most direct way is to use Bragg reflectors with slightly different wavelengths, located in the optical fibers. As long as these wavelengths are within the gain peak of the semiconductor laser different wavelengths of operation will be obtained. Since each laser output is confined to a single mode fiber, different wavelengths of emission can be combined into one output optical fiber using conventional multiplexing techniques. An example of such a multiplexing device is an array of asymmetric Mach-Zehnder interferometers (MZI) for example, as described in "Integrated Four-Channel Mach-Zehnder Multi/Demultiplexer Fabricated with Phosphorous Doped $SiO_2$ Waveguides on Si," B. H. Verbeek, C. H. Henry, N. A. Olsson, K. J. Orlowsky, R. F. Kazarinov, B. H. Johnson, *Journal of Lightwave Technology*, Vol. 6, No. 6, pp. 1011–1015, June 1988.

A more attractive way of combining different wavelengths is to provide all functions, i.e. mode transformer, single mode stabilization of multimode broad area lasers at different wavelengths and combination of these wavelengths into a single mode output, on a single integrated chip, incorporating an MZI, similar to that disclosed in the B. H. Verbeek, et al publication noted above. FIG. 7 shows a schematic diagram of such an integrated planar lightwave circuit (PLC). It comprises an array of multimode broad area lasers L (such as the laser 1 depicted in FIG. 1) coupled to an array of optical mode transformer circuits MT4 of the type described with reference to FIGS. 1 and 2 but modified to contain only waveguide sections 110, 120 and 130. The MZI is formed from single mode ridge waveguides each similar in cross-section to that of waveguide section 130 of FIG. 1. The lasers L have respective wavelengths λ1, λ2, λ3, λ4 and are coupled to the input sections (c.f. section 110 in FIG. 1) of respective mode transformers MT4. Light output of each mode transformer MT4 is coupled to a MZI type multiplexer. Outputs from pairs of mode transformers MT4 are coupled to respective MZI stages MZ1a and MZ1b, the outputs of which are coupled to a further MZI stage MZI2, the output from which is coupled to a waveguide structure MT5 comprising the output section 140 as described with reference to 1 (or FIG. 2). The MZI stages include, in the usual manner, 3 db couplings WC between their waveguides as illustrated in FIG. 7. The MZI stages include, in the usual manner, 3 db couplings between their waveguides WG1, WG2; WG3, WG4; and WG2, WG3, as illustrated in FIG. 7, to define phase loops around the portions of the waveguides between the 3 db couplers. Between the 3 db couplings associated with the waveguides WG3, WG4, the waveguide WG3 is incrementally longer (by an amount L1) than the waveguide WG4, the increment L1 being selected so that the fundamental modes of the optical signals having wavelengths λ3 and λ4 received from the lasers outputting those wavelengths, are interleaved on the waveguide WG3. Waveguides WG1 and WG2 include a similar phase shift loop functioning to interleave the fundamental modes of the optical signals having wavelengths λ1 and λ2 on the waveguide WG2. In turn, the 3 db couplings between the waveguides WG2 and WG3 define a phase shift loop serving to interleave the fundamental mode optical signals in a sequence λ1, λ2, λ3, λ4 on waveguide WG3 which is coupled by the waveguide output section MT5 to the output port 104. (It will be appreciated that the structure shown in FIG. 7 comprising the sections MT4, MZ1 and MT5 is a modification of the mode transformer 2 described with reference to FIG. 1, in which the single mode section 103 has been replaced by a MZI waveguide structure. The individual waveguides of the MZI structure are constructed in the same manner as the waveguide 102 of the section 130 in FIG. 1 or FIG. 2 in which the ridge 102c of the core layer 102a has a uniform width W2 supporting single mode propagation. Each mode transformer section MT4, containing only sections 110 and 120, is used to transform the vertically divergent multimode beam of a broad area pump laser L to a single fundamental mode in a waveguide (c.f. waveguide section 130, FIG. 1) of the MZI sections MZ1a and MZ1b. Mode transformer section MT5, containing only output waveguide section 140 (as shown in FIG. 1), is used to provide a single (fundamental) mode output beam suitable for coupling to a lensed optical fiber, such as the optical fiber 3 and lens 4, shown in FIG. 1. The mode transformer sections MT4 are coupled by MZIs which also couple the different pump lasers L into a common single mode waveguide of the mode transformer section MT5. To form a laser array, a common reflecting surface, 106, analogous to the output surface 106 of the mode transformer 2 of FIG. 1, is provided at the front surface of the structure depicted in FIG. 7.

Figure 8:
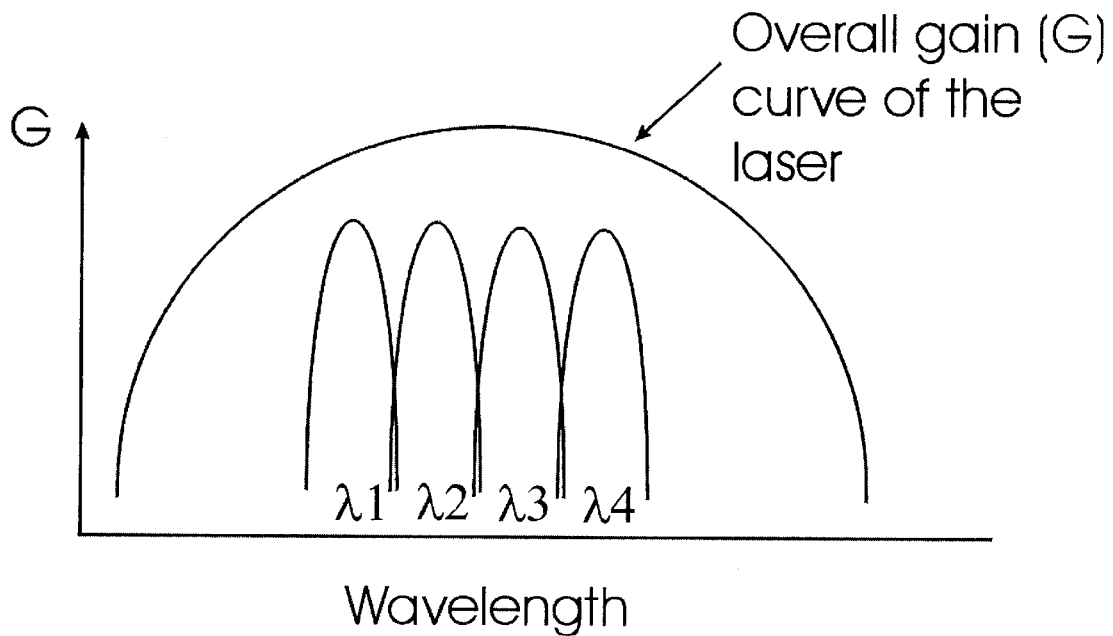
FIG. 8 depicts an optical gain curve of a solid state laser.

The optical path between each laser N of the array shown in FIG. 7 and the common reflector 104 transmits only a single wavelength $\lambda_N$. This wavelength is selected by the design of the MZI multiplexer. The return path transmits the same wavelength $\lambda_N$ back to the laser chip. In this direction the MZ1 circuit acts as demultiplexer. A single reflecting surface 106 can thus provide feedback to an array of lasers provided the wavelengths passed by the MZ1 are within the gain curve of each semiconductor laser L. This principle is illustrated in FIG. 8 where the passband of each individual MZ1 channel and the gain curve of the semiconductor laser are plotted together as a function of wavelength.

It will be apparent to those skilled in the art that further developments and modifications of the invention may be realized within the scope of the claims.

What is claimed is:

1. An optical waveguide mode transformer comprising:
   a substrate supporting an optical waveguide structure including a high refractive index core layer disposed between cladding material having a lower refractive index, said waveguide structure extending along a substrate surface, said core layer including an upstanding ridge on said core layer and spaced from opposite lateral edges of said core layer,
   said core layer including an input waveguide section coupled by an intermediate waveguide section to an output waveguide section,
   said intermediate waveguide section including a tapered region of said core layer ridge;
   said input waveguide section having a wide core layer ridge to accept a multimode light input including a fundamental mode,
   said output waveguide section including a narrow output end core layer ridge region to support propagation of single mode light output in said fundamental mode,
   said tapered region of the core layer ridge having a taper length to effect an adiabatic intensity transfer of said fundamental mode light from said input waveguide section to said output waveguide section while suppressing other modes of said multimode light input; and
   wherein said output waveguide section includes a narrow output region comprising a narrow core layer ridge portion preceded by a double-tapered core layer ridge region functional initially to expand and then contract the width of the fundamental mode light received from said intermediate waveguide section, said narrow output region supporting single mode propagation of said fundamental mode light; and in said output waveguide section, said core layer underlying said ridge is separated from opposite outer edge margin areas of said core layer by interposed cladding material to define a tapered interface between said outer edge margins of said core layer and said cladding material, said tapered interface increasing in width towards the output end surface of said optical waveguide transformer.

2. An optical waveguide transformer according to claim 1, wherein said output section core layer ridge comprises an increasing width taper region, a decreasing width taper region, and said narrow output end region, said decreasing taper region having a wider end that is wider than the wider end of said increasing taper region.

3. An optical waveguide transformer according to claim 1, wherein said core layer, said ridge and said cladding layers each comprises a silicon compound.

4. An optical waveguide transformer according to claim 3, wherein said core layer and said ridge each comprise silicon nitride.

5. An optical waveguide transformer according to claim 4, wherein said cladding layers comprise a silicon oxide.

6. An optical waveguide transformer according to claim 1, wherein said core layer and said ridge comprise different silicon compounds.

7. An optical waveguide transformer according to claim 5, wherein said core layer comprises silicon nitride and said ridge comprises doped silicon oxide having a lower refractive index than the core layer.

8. An optical waveguide mode transformer according to claim 1, wherein the core layer extends between two end surfaces of said waveguide structure, a said end surface at the input waveguide section including an antireflective coating, and a said end surface at the output waveguide section including a low reflectivity coating.

9. An external cavity solid state laser comprising:
a solid state laser coupled to output a divergent beam, multimode optical signal, including a fundamental mode, to an optical waveguide mode transformer, said solid state laser and said optical waveguide mode transformer having anti-reflective coated neighboring end surfaces; said solid state laser and said optical waveguide mode transformer each having a low reflectivity coated opposite end surface;
said optical waveguide mode transformer comprising a substrate supporting low refractive index cladding material on either side of a high refractive index core layer;
said core layer including a lengthwise extending localized region of increased thickness defining a ridge upstanding from a surface of said core layer and spaced from opposite lateral edges of said core layer, said ridge having a height relative to the core layer thickness such that the ridge defines lateral waveguiding boundaries of at least said input and intermediate waveguide sections, said lengthwise extending ridge having a width that functionally changes along its length to accept said multimode optical signal output from said solid state laser and to transform said fundamental mode of said multimode optical signal to a single fundamental mode optical signal, without significant loss of intensity of said fundamental mode signal, to an output section of said optical waveguide mode transformer which supports single mode propagation of said fundamental mode optical signal.

10. An external cavity solid state laser according to claim 9, wherein said optical waveguide transformer core layer ridge is wide at the end of the optical waveguide transformer neighboring said laser and then transitions over a narrowing taper region to a narrow width supporting single mode propagation of said fundamental mode optical signal, said narrowing tapered region effecting said transformation of the fundamental mode of said multimode optical signal to said single, fundamental mode optical signal.

11. An external cavity solid state laser according to claim 10, wherein said optical waveguide transformer core layer ridge transitions from said narrowing tapered region over a increasing width taper section to a decreasing width taper section to said narrow width supporting single mode propagation of said fundamental mode optical signal.

12. An external cavity laser according to claim 9, including a single mode optical fiber coupled to receive said fundamental mode optical signal from said output section of the optical waveguide transformer.

13. An optical system comprising:
a solid state laser coupled to output a divergent beam, multimode optical signal, including a fundamental mode,
an optical waveguide mode transformer, and
a cylindrical lens intermediate said solid state laser and said optical waveguide mode transformer,
said solid state laser and said optical waveguide mode transformer having anti-reflective coated end surfaces; said solid state laser and said optical waveguide mode transformer each having a reflective coated opposite end surface, the reflective coating of said mode transformer opposite surface having a low reflectivity;
said waveguide mode transformer comprising:
an optical waveguide structure including a substrate supporting a high refractive index core layer between lower refractive index cladding layers, said core layer including a localized region of increased thickness defining a ridge upstanding from a surface of said core layer and spaced from opposite lateral edges of said core layer, said core layer including an input waveguide section having a wide ridge coupled by an intermediate waveguide section including a tapered ridge to an output waveguide ridge section;
said input waveguide section ridge having a width to accept a multimode, including a fundamental mode, light input,
said output waveguide section having a ridge width to support a single mode light output comprising said fundamental mode, and
said tapered ridge section having a taper length enabling adiabatic transfer of said fundamental mode of said multimode light from said wide input waveguide section ridge to said output waveguide section ridge;
said cylindrical lens positioned to receive said optical signal output by said solid state laser and to direct said signal to the wide input waveguide section of said optical waveguide mode transformer; and
said antireflective coated end surface of the optical waveguide mode transformer being inclined at an angle to the antireflective coated end surface of said solid state laser.

14. An external cavity solid state laser comprising;
a solid state laser coupled to output a divergent beam, multimode optical signal, including a fundamental mode, to a first optical waveguide mode transformer;
said solid state laser and said optical waveguide mode transformer having anti-reflective coated neighboring front and back end surfaces, respectively; said solid state laser and said optical waveguide mode transformer each having a reflective coated opposite back and front end surfaces, respectively;
and a second, feedback optical waveguide mode transformer device coupled to said solid state laser at said back end surface of the solid state laser;
said first optical waveguide mode transformer comprising a substrate supporting low refractive index cladding material on either side of a high refractive index core layer;
said core layer having a lengthwise extending ridge having a width that functionally changes along its length from a wide input section to accept said multimode optical signal output from said solid state laser and to transform said fundamental mode of said multimode optical signal to a single fundamental mode optical signal, without significant loss of intensity of said fundamental mode signal, to a narrow output section of said core layer that supports single mode propagation of said fundamental mode optical signal;

said narrow output section perpendicularly intersecting said front end surface of the first optical waveguide mode transformer; and said wide input section intercepting said back end surface of the first optical waveguide transformer at a non-perpendicular angle;

said solid state laser including an active region extending between and tilted at a non-perpendicular angle with respect to said front and back end surfaces of the solid state laser;

said second, feedback optical waveguide transformer comprising a substrate supporting low refractive index cladding material on either side of a high refractive index core layer; said core layer having a lengthwise extending ridge having a width that functionally changes along its length from a wide input section to accept a multimode optical signal output from said back end surface of said solid state laser and to transform said fundamental mode of said multimode optical signal to a single fundamental mode optical signal, without significant loss of intensity of said fundamental mode signal, to a narrow output section of said core layer that supports single mode propagation of said fundamental mode optical signal; said narrow output section perpendicularly intersecting said reflective coated back end surface of the second optical waveguide mode transformer; and said wide input section intercepting the front end surface of the second optical waveguide transformer at a non-perpendicular angle;

in each of said first and second optical waveguide mode transformers, said core layer including a localized region of increased thickness defining a ridge upstanding from a surface of said core layer and spaced from opposite edges of said core layer;

the active region of said solid state laser lengthwise aligned with the wide input sections of the core layers of both said first and second optical waveguide mode transformers.

15. An optical waveguide multiplexer comprising:

a pair of solid state lasers each coupled to output a divergent beam, multimode optical signal, including a fundamental mode, to respective first and second optical waveguide mode transformers; each of said lasers outputting a different wavelength optical signal within the gain-wavelength characteristic of both lasers;

each of said first and second optical waveguide mode transformers comprising a substrate supporting a high refractive index core layer disposed between low refractive index cladding layers; said core layer of each of said first and second optical waveguide mode transformers including a localized region of increased thickness defining a lengthwise extending ridge upstanding from a surface of said core layer and spaced from opposite outer edges of said core layer, said lengthwise extending ridge having a width that functionally changes along its length to accept said multimode optical signal output from the solid state laser to which it is coupled and to transform the fundamental mode of said multimode optical signal to a single, fundamental mode optical signal, without significant loss of intensity of said fundamental mode signal;

a Mach-Zehnder Interferometer structure comprising first and second waveguide sections coupled to receive said fundamental mode optical signals from the first and second optical waveguide mode transformers, respectively; each of said first and second waveguide sections comprising a high refractive index core layer disposed between low refractive index cladding layers to support single mode propagation of the fundamental mode optical signal received from the first and second mode transformers, said core layer of each of said first and second waveguide sections including a localized region of increased thickness defining a ridge upstanding from a surface of said core layer and spaced from opposite outer edges of said core layer;

said first and second waveguide sections including spaced apart 3 db couplings, one of the first and second waveguide sections being longer than the other waveguide section in the region between the 3 db couplings to define a phase loop introducing effective to interleave said different wavelength fundamental mode, optical signals; and wherein one of said first and second waveguide sections is coupled to transfer said interleaved optical signals to an optical waveguide output section comprising a high refractive index core layer disposed between low refractive index cladding layers, said core layer of each of the first and second optical waveguide output sections including a localized region of increased thickness defining a ridge upstanding from a surface of said core layer and spaced from opposite outer edges of said core layer, said optical waveguide output section supporting single mode propagation of said interleaved fundamental mode optical signals.

16. An optical waveguide transformer according to claim 14, wherein said narrow output section core layer ridge comprises an increasing width taper region, followed by a decreasing width taper region, followed by a constant width region that intersects said back end surface of the second optical waveguide mode transformer, said decreasing taper region having a wider end that is wider than the wider end of said increasing taper region.

17. An optical waveguide transformer according to claim 16, wherein in said decreasing width taper region and said output waveguide region, said core layer underlying said ridge is separated from margin areas at said outer areas of said core layer by interposed cladding material to define a tapered interface between said margin areas of said core layer and said cladding material, said tapered interface increasing in width towards the output end surface of said optical waveguide transformer.

18. An optical waveguide transformer according to claim 15, wherein said narrow output section core layer ridge comprises an increasing width taper region, followed by a decreasing width taper region, followed by a constant width region that intersects said back end surface of the second optical waveguide mode transformer, said decreasing taper region having a wider end that is wider than the wider end of said increasing taper region.

19. An optical waveguide transformer according to claim 18, wherein in said decreasing width taper region and said output waveguide region, said core layer underlying said ridge is separated from margin areas at said outer areas of said core layer by interposed cladding material to define a tapered interface between said margin areas of said core layer and said cladding material, said tapered interface increasing in width towards the output end surface of said optical waveguide transformer.

* * * * *